(12) United States Patent
Murakami

(10) Patent No.: US 9,006,658 B2
(45) Date of Patent: Apr. 14, 2015

(54) THERMAL DETECTOR

(71) Applicant: Seiko Epson Corporation, Tokyo (JP)

(72) Inventor: Yasuhiko Murakami, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/036,470

(22) Filed: Sep. 25, 2013

(65) Prior Publication Data

US 2014/0057444 A1 Feb. 27, 2014

Related U.S. Application Data

(63) Continuation of application No. 13/012,937, filed on Jan. 25, 2011, now Pat. No. 8,569,699.

(30) Foreign Application Priority Data

Jan. 27, 2010 (JP) ................. 2010-015123

(51) Int. Cl.
G01J 5/20 (2006.01)
B81C 1/00 (2006.01)
G01J 5/02 (2006.01)
G01J 5/10 (2006.01)
G01J 5/34 (2006.01)

(52) U.S. Cl.
CPC ............ B81C 1/00523 (2013.01); G01J 5/024 (2013.01); G01J 5/10 (2013.01); G01J 5/20 (2013.01); G01J 5/34 (2013.01)

(58) Field of Classification Search
USPC ................ 250/330, 332, 338.1, 338.3, 338.4
See application file for complete search history.

(56) References Cited

U.S. PATENT DOCUMENTS

| | | |
|---|---|---|
| 5,719,073 A | 2/1998 | Shaw et al. |
| 5,846,849 A | 12/1998 | Shaw et al. |
| 5,847,454 A | 12/1998 | Shaw et al. |
| 6,051,866 A | 4/2000 | Shaw et al. |
| 6,372,656 B1 | 4/2002 | Laermer et al. |
| 6,392,233 B1 | 5/2002 | Channin et al. |
| 7,394,677 B2 | 7/2008 | Murakami et al. |
| 7,577,012 B2 | 8/2009 | Murakami |
| 2008/0304544 A1 | 12/2008 | Kvisteroy et al. |
| 2009/0266987 A1 | 10/2009 | Honda et al. |

FOREIGN PATENT DOCUMENTS

| | | |
|---|---|---|
| JP | 03-211427 A | 9/1991 |
| JP | 07-263710 A | 10/1995 |
| JP | 08-506857 A | 7/1996 |
| JP | 10-261616 A | 9/1998 |
| JP | 2000-114607 A | 4/2000 |
| JP | 2005-158128 A | 6/2005 |
| JP | 2006-112869 A | 4/2006 |
| JP | 2006-202364 A | 8/2006 |
| JP | 2006-209859 A | 8/2006 |

(Continued)

*Primary Examiner* — Mark R Gaworecki
(74) *Attorney, Agent, or Firm* — Global IP Counselors, LLP

(57) ABSTRACT

A thermal detector includes a fixed part, a thermal detection device, a supporting member, a cavity and a connection portion. The supporting member has a first plane and a second plane opposing to the first plane. The cavity is formed between the first plane and the fixed part. The connection portion connects the supporting member with the fixed part. The connection portion includes a curvature plane between the supporting member and the fixed part and the curvature plane facing the cavity.

4 Claims, 11 Drawing Sheets

(56) References Cited

FOREIGN PATENT DOCUMENTS

| JP | 2007-019278 A | 1/2007 |
| JP | 2007004931 A | 1/2007 |
| JP | 2007-071885 A | 3/2007 |
| JP | 2007-109330 A | 4/2007 |
| JP | 2007-227548 A | 9/2007 |
| JP | 2008-027554 A | 2/2008 |
| JP | 2008-042340 A | 2/2008 |
| JP | 2009-031197 A | 2/2009 |
| JP | 2009-070443 A | 4/2009 |

THERMAL DETECTOR

CROSS-REFERENCE TO RELATED APPLICATIONS

This is a continuation application of U.S. patent application Ser. No. 13/012,937 which claims priority to Japanese Patent Application No. 2010-015123 filed on Jan. 27, 2010. The entire disclosure of Japanese Patent Application No. 2010-015123 is hereby incorporated herein by reference.

BACKGROUND

1. Technical Field

The present invention relates to a Method for manufacturing a MEMS device, to a method for manufacturing an infrared detector or other thermal detector, to a thermal detector and thermal detection device, and to an electronic instrument or the like.

2. Related Art

Known thermal detection devices include pyroelectric or bolometer-type infrared detection devices. An infrared detection device detects infrared rays by creating an electromotive force (pyroelectric-type) or varying a resistance value (bolometer-type) in a thermal infrared detection element on the basis of heat evolved by infrared absorption in an infrared-absorbing film. The infrared detection element is supported by a support member, and cavity for thermal separation is formed between the support member and a substrate.

In order to reduce dissipation of heat from the thermal infrared detection element, a support arm portion whereby the support member is linked to the substrate is preferably formed narrow and long to reduce thermal conductance and minimize the heat capacity thereof. However, forming the support arm narrow and long leads to inadequate rigidity thereof. When the rigidity of the support arm is inadequate, the support member adheres to and can no longer be separated from the bottom surface of the cavity during processing (sticking occurs), or the orientation of the detection element changes during use, and the light receiving efficiency thereof declines.

Techniques have therefore been proposed whereby a chamfer, shoulder, or the like for increasing the two-dimensional moment of the cross-section in terms of the longitudinal section is formed in the support arm to increase the flexural rigidity thereof (Japanese Laid-Open Patent Publication No. 2009-31197 and Japanese Laid-Open Patent Publication No. 2007-71885).

SUMMARY

However, the degree to which the flexural rigidity of the support arm can be increased is limited, regardless of the cross-sectional shape of the support arm, which is formed narrow and long in order to reduce thermal conductance.

Through aspects of the present invention, it is possible to provide a MEMS (Micro Electro Mechanical Systems) manufacturing method which is optimal for processing a linking structure or support structure for reducing thermal conductance, and to provide a method for manufacturing a thermal detector.

Through other aspects of the present invention, it is possible to provide a thermal detector and thermal detection device whereby the structure for linking or supporting an arm on a fixed part is improved, and heat dissipation from the thermal infrared detection element can be reduced.

Through other aspects of the present invention, it is possible to provide a thermal detector, thermal detection device, and electronic instrument whereby the structure for linking or supporting an arm on a fixed part is improved, and heat dissipation from the thermal infrared detection element can be reduced.

An aspect of the present invention is a method for manufacturing a MEMS device, for processing an etching layer having a first cavity, the etching layer being formed on a fixed part; and the method for manufacturing a MEMS device is characterized in comprising a first step of forming a mask layer on at least a side wall of an exposed surface of the etching layer, at which the etching layer faces the first cavity; and a second step of directing an etchant fed into the first cavity on a surface side of the mask layer to a back surface side of the mask layer, isotropically etching the etching layer, forming a second cavity communicated with the first cavity on the back surface side of the mask layer, and processing the etching layer.

According to an aspect of the present invention, since the side wall of the exposed surface of the etching layer, at which the etching layer faces the first cavity, is covered by the mask layer, isotropic etching of the side wall is prevented by the mask layer, and isotropic etching initially does not proceed. As isotropic etching proceeds, the etchant runs along the end part from the surface side of the mask layer and eventually feeds to the back surface side, thereby gradually enlarging the region of the second cavity. Isotropic etching of the etching layer thereby proceeds from deep to shallow in the depth direction of the first cavity, backwards in the depth direction. The amount of etching increases the greater the depth position is in the depth direction of the first cavity, and an undercut shape is formed.

In the method for manufacturing a MEMS device according to an aspect of the present invention, a configuration may be adopted in which the mask layer is formed also on a bottom wall of the etching layer, the bottom wall facing the cavity in the first step; and the method for manufacturing a MEMS device further comprises a step of forming an etchant feeding hole through which the etchant passes in the mask layer, the step being performed between the first step and the second step.

Through this configuration, the undercut shape formed in the linking part can be controlled in the desired manner by selecting the number, position, size, and other characteristics of the etchant feeding hole.

The method for manufacturing a thermal detector according to another aspect of the present invention is characterized in comprising the steps of forming a mask layer on at least a side wall of an exposed surface of an etching layer having a first cavity, the etching layer being formed on a fixed part, and the etching layer facing the first cavity at the side wall; forming a sacrificial layer in the first cavity; forming a support layer on the etching layer and the sacrificial layer; forming a thermal detection element on the support layer; isotropically etching the support layer to process the support layer into a support member for supporting the thermal detection element and expose the sacrificial layer; removing the sacrificial layer by isotropic etching to expose the first cavity; and directing an etchant fed into the first cavity on a surface side of the mask layer to a back surface side of the mask layer, isotropically etching the etching layer, forming a second cavity communicated with the first cavity on the back surface side of the mask layer, and forming the etching layer into a linking part for linking the support member and the fixed part.

According to the method for manufacturing a thermal detector according to another aspect of the present invention, an undercut shape can be formed in the linking part by using the principle of the method for manufacturing a MEMS device described above. By temporarily embedding the first cavity in the sacrificial layer, the support member or the thermal detection element can be formed above the first cavity, and after the sacrificial layer is subsequently removed, the method for manufacturing a MEMS device described above can be employed. Through this method, since the linking part can be formed having a cross-sectional area which is smaller on the side of the fixed part than on the side of the support member, the support strength of the linking part can be enhanced, and thermal conductance can be reduced, as described hereinafter.

In the method for manufacturing a thermal detector according to another aspect of the present invention, a configuration may also be adopted in which the mask layer is formed also on a bottom wall at which the etching area faces the cavity in the mask layer formation step, and the method for manufacturing a thermal detector further comprises a step of forming an etchant feeding hole through which the etchant passes in the mask layer, the step being performed after forming the mask layer and before the step of isotropically etching the etching layer. In this case as well, the undercut shape formed in the linking part can be controlled in the desired manner, and the support strength or thermal conductance of the linking part can be adjusted by selecting the number, position, size, and other characteristics of the etchant feeding hole.

The thermal detector according to another aspect of the present invention is characterized in comprising a fixed part; a thermal detection element; a support member having a first surface and a second surface which faces the first surface, wherein a cavity for thermal separation is formed between the first surface and the fixed part, and the support member supports the thermal detection element on the second surface; and a linking part for linking the support member to the fixed part; wherein the linking part is formed so that the cross-sectional area thereof is smaller on the side of the fixed part than on the side of the support member.

In the thermal detection element, when the support member side is designated as being in the upward direction, for example, the linking part is formed so as to have a smaller cross-sectional area on the side of the fixed part than on the side of the support member, and thereby has an undercut shape. Since this undercut shape enables a larger area to be maintained for supporting the linked end part by the support member, support strength is enhanced by distributing stress. Since the cross-sectional area is smaller on the side of the fixed part, thermal conductance can be reduced in proportion to the cross-sectional area, and it is possible to reduce the amount of heat that moves from the infrared detection element as a heat source to the side of the fixed part via the support member and the linking part. In other words, forming the linking part with a small cross-sectional area enables a thermal-resistance-increasing part to be maintained in the linking part.

In the thermal detector according to another aspect of the present invention, a configuration may be adopted in which the support member comprises a mounting member for mounting the thermal detection element; and at least one arm extending toward a linked end part from a proximal end connected to the mounting member; wherein the linking part comprises a first linking part for linking the fixed part and the linked end part of the at least one arm.

In other words, the shape of the linking part described above can be applied to the first linking end part for linking the fixed part and the linked end part of the end part of the arm to ensure support strength and reduced thermal conductance at the end part of the arm.

In the thermal detector according to another aspect of the present invention, a configuration may also be adopted in which the first linking part is formed so that a second edge thereof adjacent to the fixed part side is shorter than a first edge adjacent to the linked end part side in a longitudinal section in the extension direction of the at least one arm.

Through this configuration, in the first linking part, since the length parallel to the first and second edges varies even when the width in the direction orthogonal to the first and second edges is constant, the cross-sectional area obtained by multiplying the width by the length can be made smaller on the fixed part side than on the support member side, and a thermal-resistance-increasing part can be formed.

In the thermal detector according to another aspect of the present invention, a third edge linking the first edge and the second edge and facing the cavity is preferably curved in a longitudinal section of the first linking part.

Through this configuration, the first linking part is endowed with an arch shape, the load from the side of the support member 80 is transmitted as axial compression, and the bending moment which occurs at the top part or the side walls 102 is significantly reduced. Greater support strength can therefore be maintained.

In the thermal detector according to another aspect of the present invention, the linking part may further comprise a second linking part for linking the support member and the fixed part at a position other than that of the linked end part, the second linking part being formed in a columnar shape within the cavity.

The second linking part links the arm to the fixed part at a middle position other than that of the linked end part of the arm, and can thereby prevent the narrow, long arm from flexing due to inadequate flexural rigidity. Since the second linking part also serves as a heat transfer path, the same as the first linking part, a thermal-resistance-increasing part can also be maintained in the second linking part by forming the second linking part so that the cross-sectional area thereof is smaller on the fixed part side than on the support member side thereof.

In the thermal detector according to another aspect of the present invention, the shape of the longitudinal section of the second linking part may have line symmetry about the longitudinal center line of the second linking part. A line-symmetrical longitudinal sectional shape can easily be formed by causing isotropic etching to proceed from the entire periphery of the columnar portion prior to processing the second linking part. Isotropic etching is performed from the entire periphery, the cross-sectional area is reduced, and high thermal resistance can be maintained.

In the thermal detector according to another aspect of the present invention, a configuration may be adopted in which the thermal detector further comprises a spacer member extending in a columnar shape within the cavity toward a free end part on the side of the fixed part from a proximal end on the side of the support member, at a position other than that of the linked end part; wherein a gap communicated with the cavity is formed between the fixed part and the free end part of the spacer member.

Through this configuration, the interval between the support member and the fixed part can be maintained by the spacer member while the solid heat transfer path between the support member and the fixed part is completely blocked. Since the gap can be formed in the isotropic etching step, which is substantially the final step, the support member and the solid part can remain linked during the manufacturing steps prior to the isotropic etching step, and sticking can be reliably prevented.

The thermal detection device according to another aspect of the present invention may comprise the thermal detector described above, arranged in two dimensions along two orthogonal axes. This thermal detection device is capable of providing a light (temperature) distribution image. A high area efficiency of the thermal detector of one cell at this time makes it possible to provide an accurate image.

The electronic instrument according to another aspect of the present invention has the thermal detection device described above, and is most suitable in thermography for outputting a light (temperature) distribution image, in automobile navigation and surveillance cameras as well as object analysis instruments (measurement instruments) for analyzing (measuring) physical information of objects, in security instruments for detecting fire or heat, in FA (Factory Automation) instruments provided in factories or the like, and in other applications.

BRIEF DESCRIPTION OF THE DRAWINGS

Referring now to the attached drawings which form a part of this original disclosure.

DETAILED DESCRIPTION OF EXEMPLARY EMBODIMENTS

Preferred embodiments of the present invention will be described in detail. The embodiments described below do not unduly limit the scope of the present invention as recited in the claims, and all of the configurations described in the embodiments are not necessarily essential means of achievement of the present invention.

1. Method for Manufacturing a MEMS Device

Figure 2A:
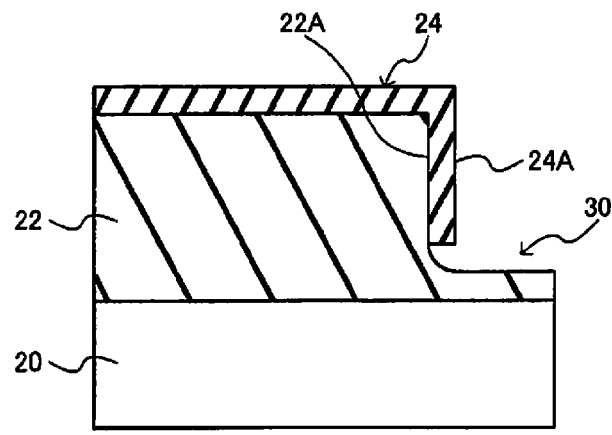
FIGS. 2A through 2C are views showing the process of isotropic etching shown in FIG. 1.
Figure 2B:
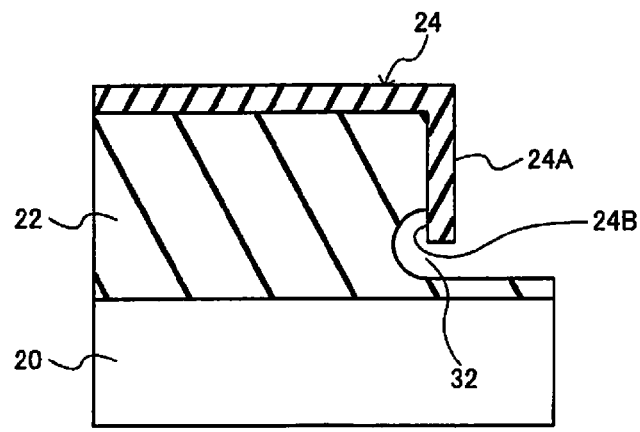
Figure 2C:
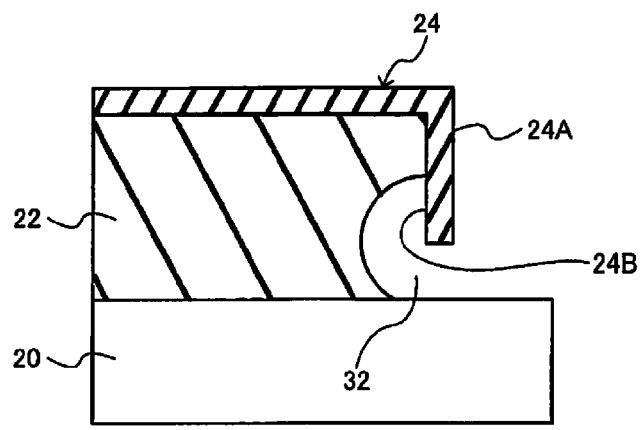
Figure 3:
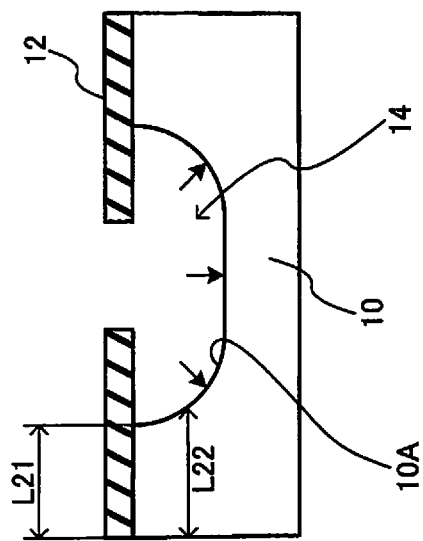
FIG. 3 is a view showing isotropic etching according to a comparative example.
Figure 3:
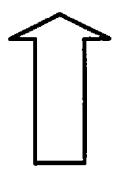
Figure 3:
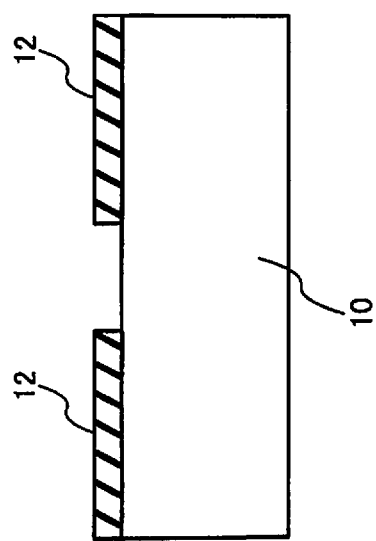

An embodiment of the method for manufacturing a MEMS device according to the invention of the present application will be described based on FIGS. 1 and 2A through 2C, and in comparison with the comparative example shown in FIG. 3. In conventional isotropic etching, a patterned mask layer 12 is formed on the surface of an etching layer 10 as shown in FIG. 3, and an etchant having a high selection ratio with respect to the etching layer 10 is fed by a dry or wet process.

A cavity 14 is formed in the etching layer 10 by this isotropic etching. At this time, since the etching layer 10 below (on the back surface side of) the mask layer 12 is also isotropically etched, the cavity 14 is formed also below the mask layer 12. As a result, a side wall 10A at which the etching layer 10 faces the cavity 14 is formed below the mask layer 12.

The shape of the side wall 10A is substantially a quarter arc. The length from the left end of the etching layer 10, for example, to the side wall 10A is the minimum value L21 at the top edge adjacent to the mask layer 12, and the length L22 further down from the top edge gradually increases above the minimum value L21. This tendency is the same as in FIG. 1 of Japanese Laid-Open Patent Publication No. 2009-31197, FIG. 2 of Japanese Laid-Open Patent Publication No. 2007-71885, and other publications.

Figure 1:
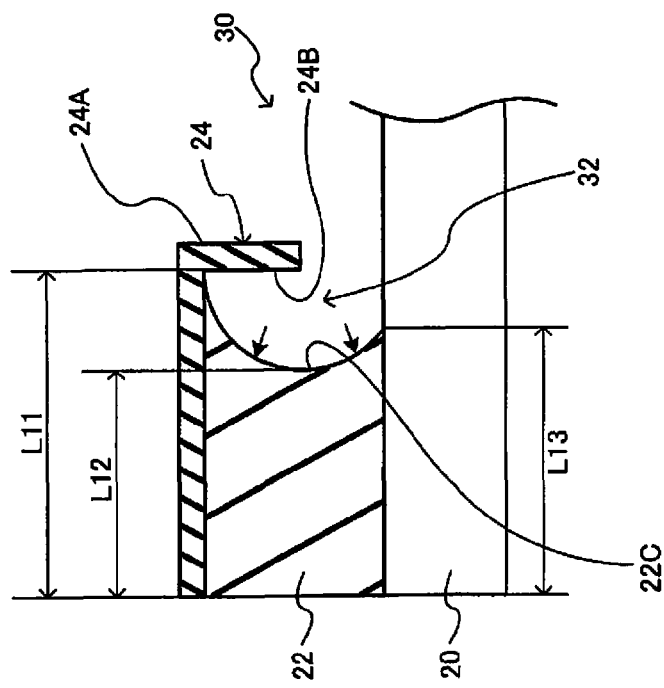
FIG. 1 is a view showing an embodiment of the method for manufacturing a MEMS device according to the present invention.
Figure 1:
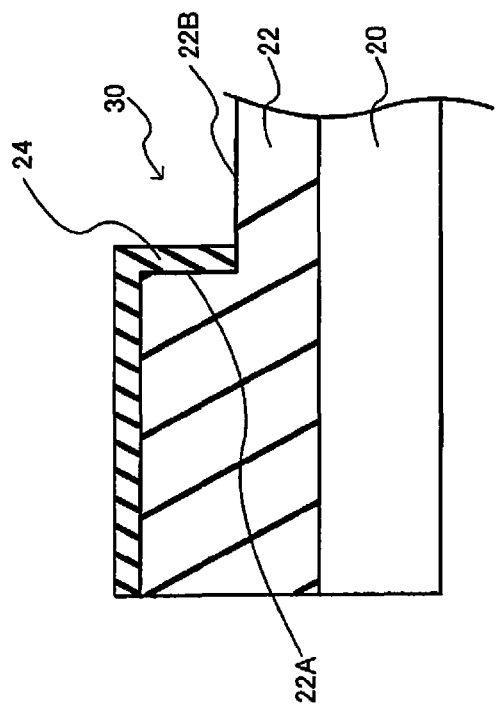

The method for manufacturing a MEMS device according to the present embodiment, however, has a first step of forming a mask layer 24 on at least a side wall 22A of an exposed surface of an etching layer 22 which has a first cavity 30, the etching layer 22 at the side wall 22A facing the first cavity 30, and the etching layer 22 being formed on a substrate 20 which is a fixed part for functioning as an etching stop layer, for example, as shown in FIG. 1. In FIG. 1, the mask layer 24 is formed also on a top surface of the etching layer 22, but in such cases as when other layers are formed on the top surface and the other layers have a low selection ratio with respect to the etchant, the mask layer 24 need not necessarily be formed on the top surface of the etching layer 22.

A bottom wall 22B at which the etching layer 22 faces the first cavity 30 is exposed in FIG. 1, but an opening (etchant feeding opening) for exposing the bottom wall 22B on the side near the mask layer 24 may be left behind so that the bottom wall 22B is covered by the mask layer 24. The opening may be formed by removing a portion of the mask layer 24 by etching, for example, after the mask layer 24 is formed.

The etching layer 22 is formed on an etching stop layer 20 having a low selection ratio with respect to the etchant in FIG. 1, but this configuration is not limiting. The etching stop layer 20 may be a substrate or other base (fixed part), for example, or an etching stop layer 20 may be formed on a substrate.

In the present embodiment, a second step is provided whereby the etchant is fed into the first cavity 30 on the side of a surface 24A of the mask layer 24 in FIG. 1, the etchant is directed toward a back surface 24B of the mask layer 24, and the etching layer 22 is isotropically etched. In the second step, a second cavity 32 communicated with the first cavity 30 is formed on the side of the back surface 24B of the mask layer 24, and the vertical side wall 22A, for example, of the etching layer 22 is processed into the shape of a side wall 22C. The side wall 22A prior to processing is not necessarily vertical, and may be inclined or curved.

In perfect isotropic etching, the etched side wall 22C of the etching layer 22 forms an arc having a substantially constant radius about a corner of the lower end of the mask layer 24 in terms of a longitudinal section. In other words, the etching layer 22 is processed into a so-called arch shape.

In other words, when the etching stop layer 20 is on the underside of the etching layer 22, the etched side wall 22C of the etching layer 22 is formed in an undercut shape by the second cavity 32. The length from the left end of the etching layer 22 to the side wall 22C, for example, is the minimum value L11 at the top edge (first edge) adjacent to the mask layer 24, the minimum length L12 at the middle position downward from the top edge, and the length L13 (L12<L13<L11) at the bottom edge (second edge) adjacent to the etching stop layer 20 further downward. The etching layer 22 is therefore formed so that the cross-sectional area thereof is smaller at a position deeper than a position of shallow depth in the depth direction of the first cavity 30.

The undercut shape essentially differs from the etched side wall 10C in FIG. 3, and the side walls disclosed in FIG. 1 of Japanese Laid-Open Patent Publication No. 2009-31197, FIG. 2 of Japanese Laid-Open Patent Publication No. 2007-71885, and other publications, and the difference in the shape of the side wall is due to a difference in the direction in which isotropic etching proceeds. In FIG. 3, isotropic etching proceeds only in the downward and sideways directions in the region below the mask layer 12.

In FIG. 1, however, since the side wall 22A facing the first cavity 30 in the etching layer 22 is covered by the mask layer 24, isotropic etching of the side wall 22A is prevented by the mask layer 24, and initially does not proceed. As isotropic etching proceeds in the region below the etching layer 22 covered by the side wall 22A, isotropic etching of the side wall 22A proceeds upward from below (from deep to shallow in the depth direction of the first cavity 30), as shown in FIGS. 2A through 2C, and the shape of the etched side wall 22C shown in FIG. 2 is formed. In this process, the etchant runs along the end part (lower end) from the surface 24A of the mask layer 24 and eventually feeds to the back surface 24B, thereby gradually enlarging the region of the second cavity 32. The amount of etching of the etching layer 22 thereby increases the greater the depth position is in the depth direction of the first cavity 30, and an undercut shape is formed.

2. Thermal Detector

2.1 Overall Structure of Thermal Detector

Figure 4A:
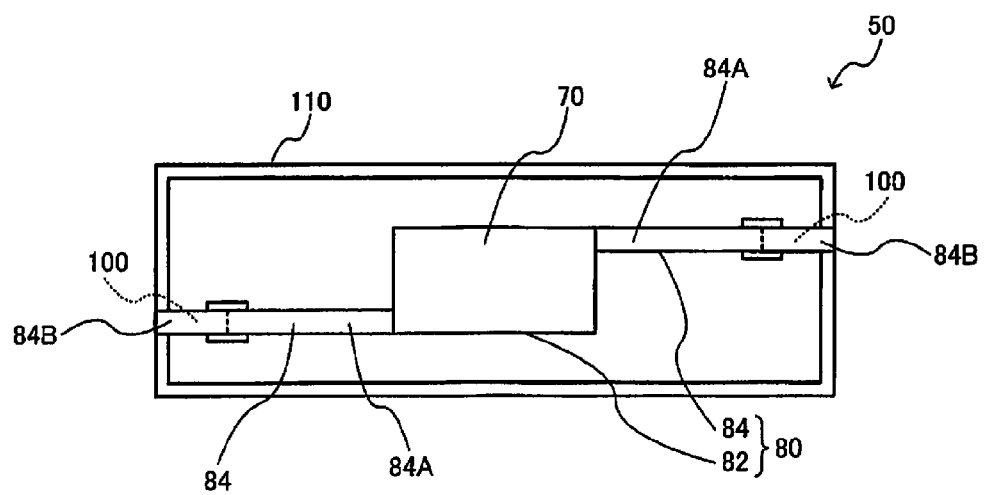
FIGS. 4A and 4B are a plan view and a sectional view, respectively, showing an embodiment of the thermal detector of the present invention.
Figure 4B:
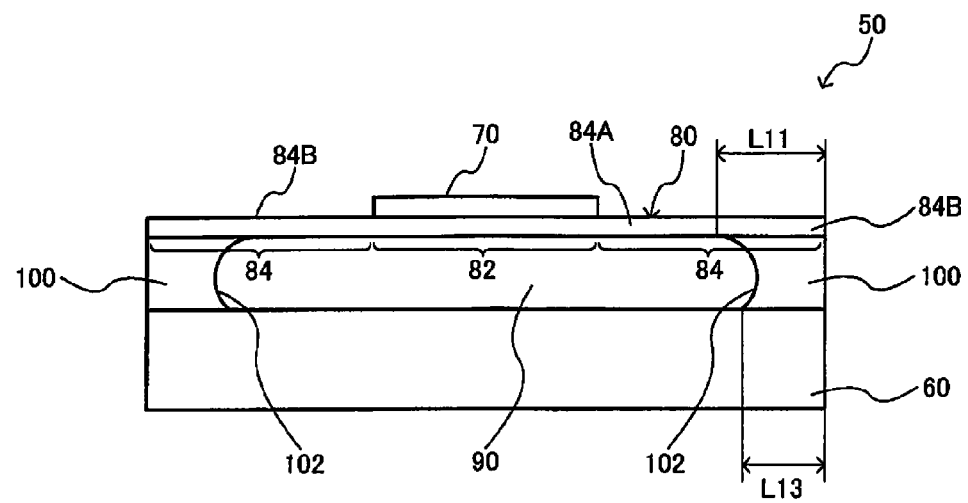

An embodiment will be described in which the method for manufacturing a MEMS device described above is applied to a method for manufacturing a thermal detector. FIGS. 4A and 4B are a plan view and a sectional view, respectively, showing the basic configuration of a thermal detector 50.

The thermal detector, e.g., infrared detector 50, shown in FIGS. 4A and 4B represents one cell, and an infrared detection device can be formed by arranging single cells of infrared detectors in orthogonal directions in two dimensions on a substrate.

As shown in FIGS. 4A and 4B, the infrared detector 50 includes a substrate 60; an infrared detection element (thermal detection element, broadly speaking) 70 which includes an infrared-absorbing film (light-absorbing film, broadly speaking); and a support member (membrane) 80 for supporting the infrared detection element 70. The substrate 60 and the support member 80 are thermally separated via a cavity 90. The infrared detection element 70 is mounted on a second surface (top surface in FIG. 4B) opposite a first surface (bottom surface in FIG. 4B) at which the support member 80 faces the cavity 90. The infrared detection element 70 will be described in detail hereinafter.

In the infrared detector 50, incident infrared rays are absorbed by the infrared-absorbing film, and heat evolved by the absorbed infrared rays causes an electromotive force to occur or changes the resistance value in the infrared detection element 70, and the infrared rays can thereby be detected. At this time, the cavity 90 is present between the substrate 60, which has a large heat capacity, and the support member 80 for mounting the infrared detection element 70. The infrared detection element 70 and the substrate 60 are therefore thermally separated, and infrared rays can be detected with minimal heat loss.

Specifically, the support member 80 may have a mounting member 82 for mounting the infrared detection element 70, and at least one arm 84, e.g., first and second arms 84, the proximal ends 84A of which are linked to the mounting member 82, and linked end parts 84B of which are linked and supported on the substrate 60 side. In the present embodiment, the two arms 84 are arranged in point-symmetrical positions, for example, about the center of the mounting member 82. Wiring layers (not shown) connected to the infrared detection element 70 may be formed in the two arms 84. A configuration may be adopted in which a single arm 84 is provided, and the wiring layers are formed in a single arm 84.

In order to thermally separate the substrate 60 and the support member 80, two end part linking posts (connecting parts or first connecting parts, broadly speaking) 100 are provided on the surface of the substrate 60, and the linked end parts 84B of the two arms 84 are supported by the two posts 100. The end part linking posts 100 are formed directly below the linked end parts 84B of the arms 84. A region that includes the space between the substrate 60 and the support member 80 can thus be created by the end part linking posts 100 to serve as the cavity 90. Since the support member 80 is supported on the substrate 60 via the end part linking posts 100, which have a small volume, the thermal conductance of the heat transfer path from the support member 80 to the substrate 60 is low, and heat dissipation from the infrared detection element 70 including the infrared-absorbing film can be reduced. The arms 84 may extend linearly in one direction as shown in FIG. 4A, or may be formed narrow and long so as to extend along two edges of a rectangular mounting part 82, as in FIG. 1A of Japanese Laid-Open Patent Publication No. 2009-31197.

A frame part 110 formed by the same layer as the end part linking posts 100 is provided on the border of the infrared detector 50 of one cell, but the frame part 110 is not essential. The substrate 60 corresponds to the fixed part in the present embodiment, but another layer (e.g., a gate oxide film or the like in the case of a MOS transistor being formed on the substrate) including the mask layer 24 may be present between the substrate 60 and the end part linking posts 100, in which case the substrate 60 and the other layer form the fixed part.

2.2 Structure of End Part Linking Posts

Linking Parts or First Linking Parts

In the infrared detector 50 of the present embodiment, the side walls 102 of the end part linking posts 100 are formed by the method for manufacturing a MEMS device described above. The side walls 102 of the end part linking posts 100 are therefore formed in an undercut shape. In other words, the end part linking posts 100 are formed so that the cross-sectional area thereof is smaller on the side of the fixed part 60 than on the side of the support member 80. In other words, the end part linking posts 100 are formed so that the length L13 of the second edge adjacent to the substrate 60 as the fixed part is shorter than the length L11 of the first edge adjacent to the linked end parts 84B of the arms 84 in terms of the longitudinal section shown in FIG. 4B along the extension direction (longitudinal direction) of the arms 84.

Since the undercut shape of the end part linking posts 100 enables a larger area to be maintained for supporting the linked end parts 84B of the arms 84, support strength is enhanced by distributing stress. Since the cross-sectional area is kept smaller on the side of the substrate 60, which is the fixed part, thermal conductance can be reduced in proportion to the cross-sectional area, and it is possible to reduce the amount of heat that moves from the infrared detection element 70 as a heat source to the side of the substrate 60 via the support member 80 and the end part linking posts 100. In other words, forming the undercut shape enables a thermal-resistance-increasing part to be formed in the end part linking posts 100.

Since the etched side wall 10B in FIG. 3, or the linking parts disclosed in FIG. 1 of Japanese Laid-Open Patent Publication No. 2009-31197, FIG. 2 of Japanese Laid-Open Patent Publication No. 2007-71885, and other publications have the opposite shape from an undercut shape, although thermal conductance may be equal, the surface area for supporting the aim end parts is small, stress is therefore concentrated, and a high support strength cannot be maintained.

In particular, third edges along the side walls 102 facing the cavity 90 and connecting the first edges of length L11 and the second edges of length L13 are curved in the longitudinal section shown in FIG. 4B, and end part linking parts 100B therefore have an arch shape.

The load from the side of the support member 80 is transmitted as axial compression by the arch-shaped end part linking posts 100, and the bending moment which occurs at the top part or the side walls 102 is significantly reduced. Greater support strength can therefore be maintained.

3. Method for Manufacturing Thermal Detector

Figure 5A:
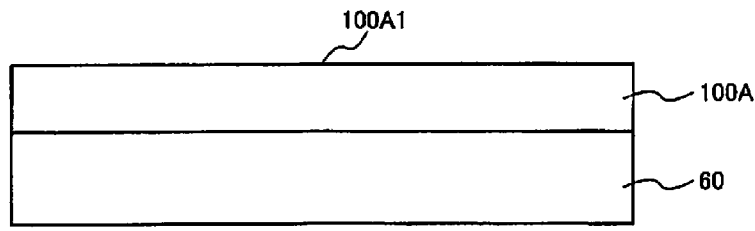
FIGS. 5A through 5E are sectional views showing the first half of the steps of the method for manufacturing the thermal detector shown in FIGS. 4A and 4B.
Figure 6A:
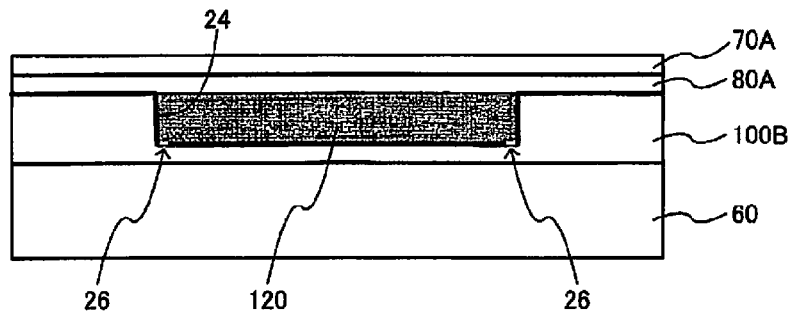
FIGS. 6A through 6E are sectional views showing the second half of the steps of the method for manufacturing the thermal detector shown in FIGS. 4A and 4B.
Figure 6B:
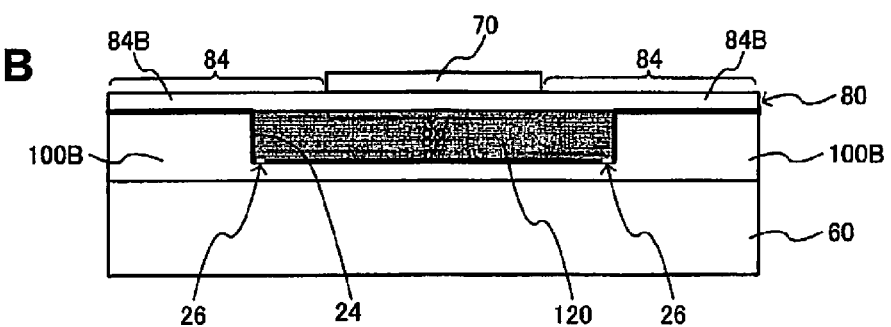
Figure 6C:
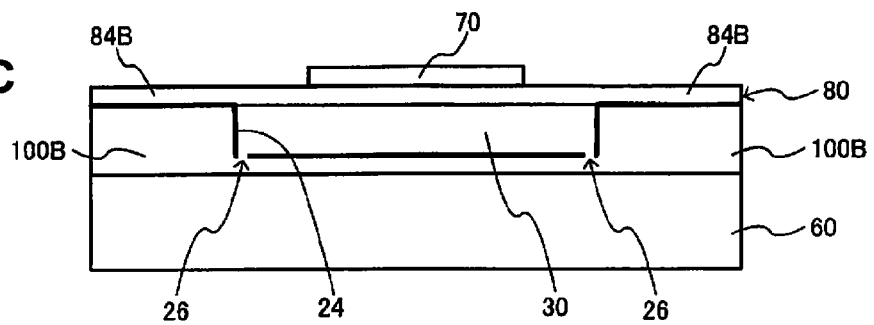
Figure 6D:
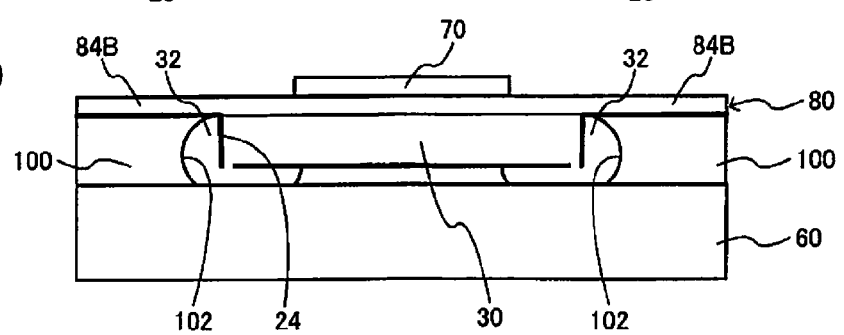
Figure 7A:
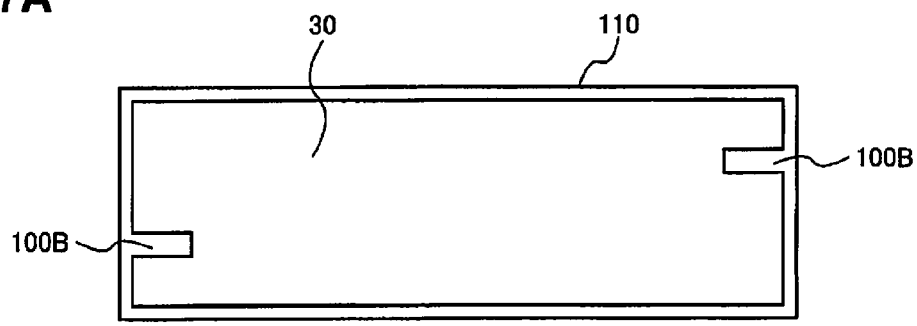
FIGS. 7A through 7C are plan views showing the steps of the method for manufacturing the thermal detector shown in FIGS. 4A and 4B.
Figure 7B:
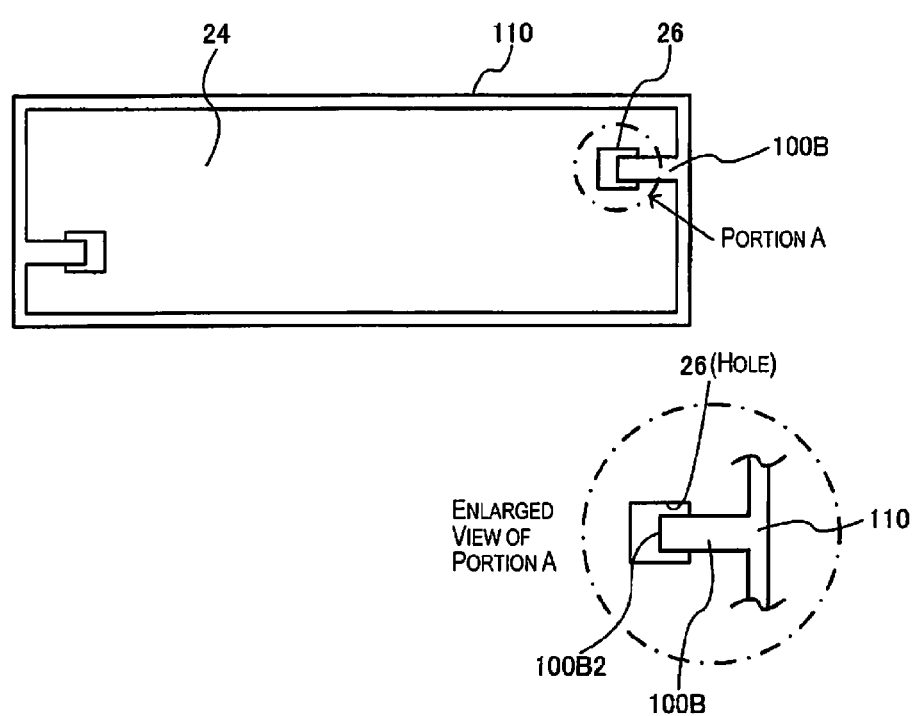
Figure 7C:
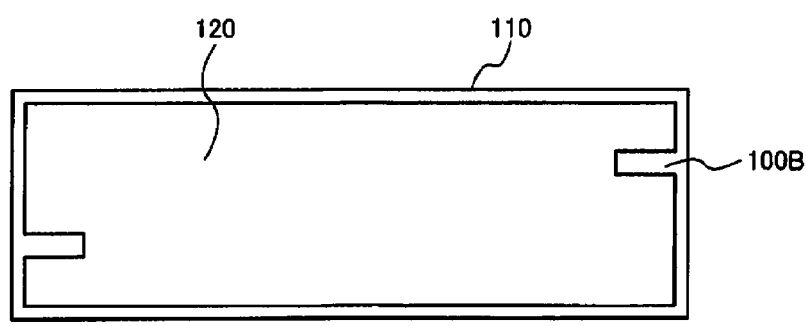
Figure 8A:
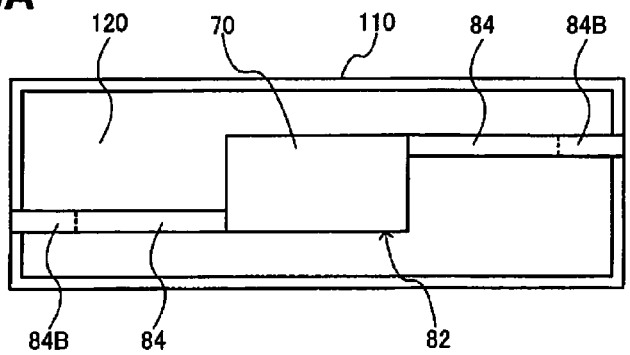
FIGS. 8A through 8C are plan views showing the steps subsequent to those shown in FIGS. 7A through 7C of the method for manufacturing the thermal detector shown in FIGS. 4A and 4B.
Figure 8B:
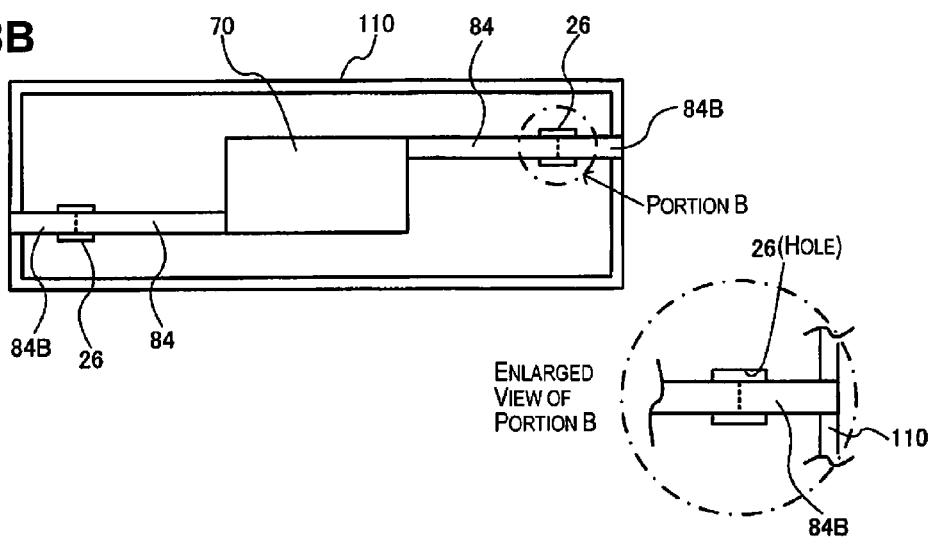
Figure 8C:
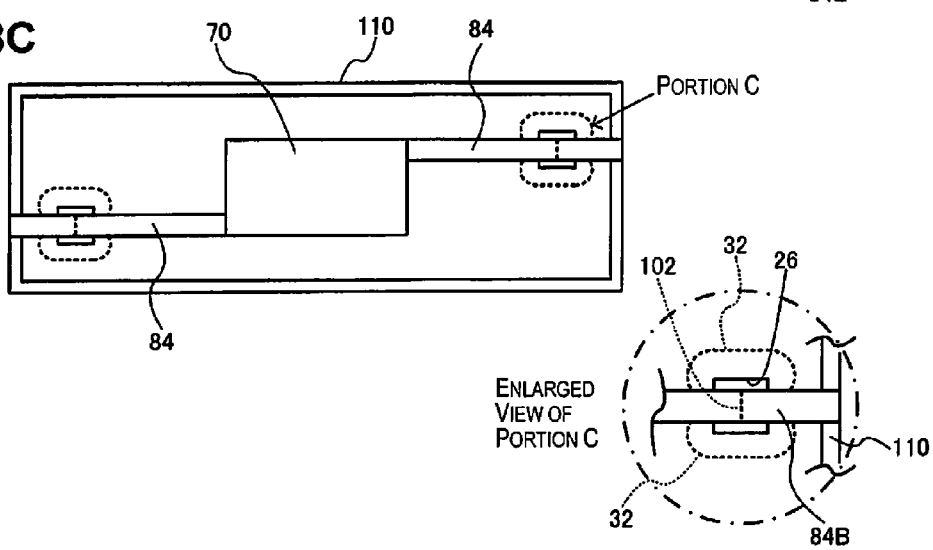

FIGS. 5A through 5E are sectional views showing the first half of the steps of the method for manufacturing the thermal detector shown in FIGS. 4A and 4B; FIGS. 6A through 6E are sectional views showing the second half of the steps of the method for manufacturing the thermal detector shown in FIGS. 4A and 4B; FIGS. 7A through 7C are plan views showing the steps of the method for manufacturing the thermal detector shown in FIGS. 4A and 4B; and FIGS. 8A through 8C are plan views showing the steps subsequent to those shown in FIGS. 7A through 7C of the method for manufacturing the thermal detector shown in FIGS. 4A and 4B.

3.1 Step of Forming Mask Layer

This step is a step of forming the mask layer 24 on at least side walls 100B2 formed by processing of the first cavity 30 in a linking layer (etching layer) 100A formed on the substrate 60 as the fixed part. First, a linking layer 100A of $SiO_2$, for example, is formed on the substrate, e.g., a silicon substrate 60, as shown in FIG. 5A. An SOI (Silicon On Insulator) may be used.

Figure 5B:
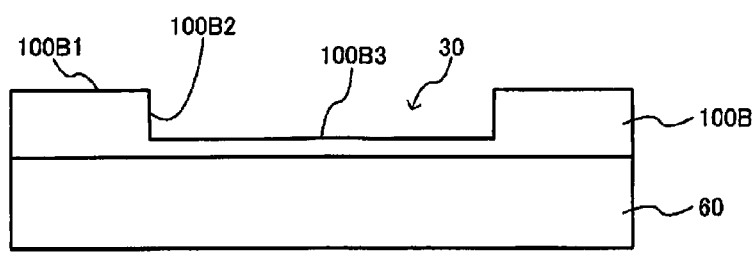

The first cavity 30 is then formed in the linking layer 100A, as shown in FIG. 5B. The first cavity 30 is formed by forming a resist mask on the surface of the linking layer 100A and applying isotropic etching, for example, to the linking layer 100A. The depth of the first cavity 30 is controlled by controlling the etching time, for example. As shown in FIG. 7A, the planar shape of the first cavity 30 is shown, and by isotropic etching, the linking layer 100A is processed, and the frame part 110 and end part linking posts 100B having vertical side walls 100B2 are formed. The end part linking posts 100B have surfaces 100B1 which are continuous with the vertical side walls 100B2, and the first cavity 30 is defined by the side walls 100B2 and a bottom wall 100B3.

Figure 5C:
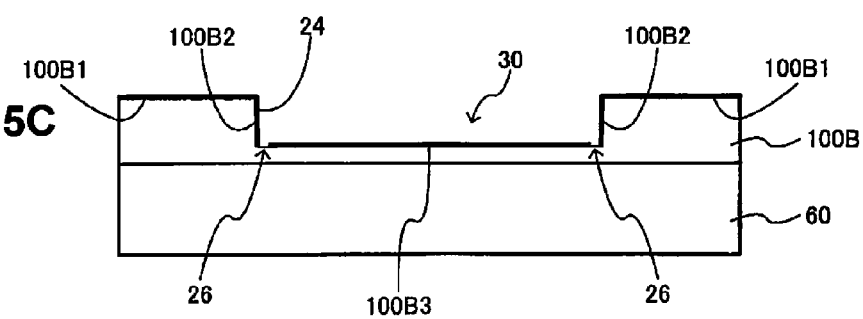

FIGS. 5C and 7B show the step of forming the mask layer 24. In the present embodiment, the mask layer 24 is formed on the entire surface of the surfaces 100B1 of the end part linking posts 100B, and the side walls 100B2 and bottom wall 100B3 for defining the first cavity 30. The mask layer 24 is formed by $Al_2O_3$, for example. Furthermore, in the present embodiment, etchant feed (openings) 26 are formed in the mask layer 24 so as to surround the side walls 100B2 of the end part linking posts 100B, as shown in FIG. 5C and the enlarged view of portion A in FIG. 7B. The etchant feeding holes 26 are formed in order to feed the etchant during formation of the end part linking posts 100 having the undercut side walls 102 by isotropic etching of the vertical side walls 100B2 of the end part linking posts 100B in a subsequent step.

3.2 Step of Forming Sacrificial Layer

Figure 5D:
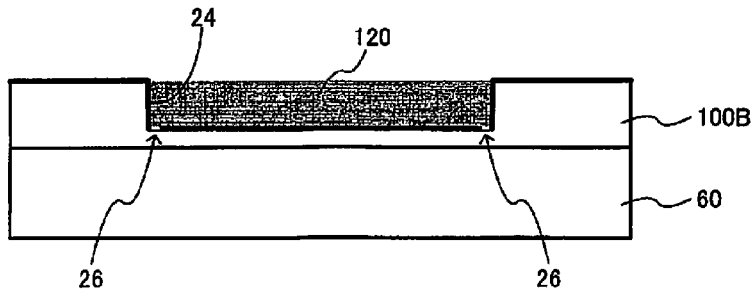

This step is a step of forming a sacrificial layer 120, for example, in the first cavity 30, and is shown in FIGS. 5D and 7C. The sacrificial layer 120 is formed by polycrystalline silicon, for example, is embedded in the first cavity 30, and the excess sacrificial layer 120 protruding from the first cavity 30 is removed by etching back. Embedding the sacrificial layer 120 in the first cavity 30 enables formation of other films on the first cavity 30, and the sacrificial layer 120 is removed after the other films are formed.

3.3 Step of Forming Support Layer

Figure 5E:
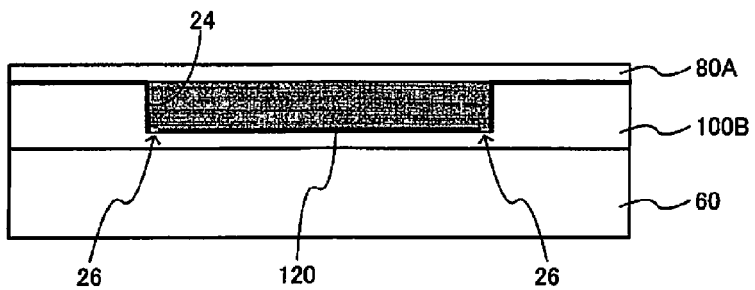

This step is a step of forming a support layer 80A on the sacrificial layer 120 and the end part linking posts 100B which are etching layers. As shown in FIG. 5E, a support layer 80A composed of a SiN film, for example, is formed by sputtering, CVD, or another method on the entire surface of the end part linking posts 100B and sacrificial layer 120.

3.4 Step of Forming Thermal Detection Element

This step is a step of forming an infrared detection element film 70A as a thermal detection element on the support layer 80A. The infrared detection element film 70A will be described in detail hereinafter. The infrared detection element film 70A is patterned as shown in FIGS. 6B and 8A, and the infrared detection element 70 is formed so that a predetermined light-receiving surface area can be maintained at the center of the one cell.

3.5 Step of Exposing Sacrificial Layer

This step is a step of isotropically etching the support layer 80A to form the support member 80 for supporting the infrared detection element 70, and exposing the sacrificial layer 120. As shown in FIGS. 6B and 8A, through isotropic etching of the support layer 80A, the mounting member 82 for mounting the infrared detection element 70 is formed, and the two, for example, first and second arms 84 are formed extending from the mounting member 82 to the linked end parts 84B. Through this isotropic etching, the sacrificial layer 120 as the layer under the support layer 80A is also exposed in the region from which the support layer 80A is removed. Examples of etchants having a high selection ratio with respect to the support layer 80A (SiN) include etching gas in which nitrogen or chlorine is added to a gas mixture of $CF_4$ and oxygen, or an etching gas in which nitrogen is added to a gas mixture of fluorine and oxygen (see Japanese Laid-open Patent Publication No. 10-261616, for example).

3.6 Step of Removing Sacrificial Layer

This step is a step of removing the sacrificial layer 120 by wet or dry isotropic etching and exposing the first cavity 30. As shown in FIGS. 6C and 8B, the exposed sacrificial layer 120 as well as the sacrificial layer 120 hidden below the support member 80 are removed by isotropic etching. At this time, the mask layer 24 functions as an etching stop layer, and the end part linking posts 100 and the frame part 110 covered by the mask layer 24 are not etched. The linking layer (SiO$_2$) exposed via the etchant feeding holes 26. The linking layer (SiO$_2$) exposed via the etchant feeding holes 26 has a low selection ratio with respect to the etchant, and is therefore also not etched. Fluorine-based gases such as SF$_6$, CF$_4$, XeF$_2$ can be cited as example of etchants having a high selection ratio with respect to polycrystalline silicon, for example, as the material of the sacrificial layer 120.

3.7 Step of Forming Undercut Shape in Linking Parts

This step is a step of directing the etchant fed into the first cavity 30 on the side of the surface 24A of the mask layer 24 to the side of the back surface 24B of the mask layer 24 and isotropically etching the end part linking posts 100B as etching layers. At this time, as shown in FIGS. 6D and 8C, the second cavities 32 communicated with the first cavity 30 are formed on the back surface 24B sides of the mask layer 24, and the end part linking posts 100B as etching layers are processed so as to form an undercut shape in the end part linking posts 100 (linking parts or first linking parts) for linking the support member 80 and the substrate 60 as the fixed part. Through this isotropic etching, the end part linking posts 100 are processed into arch shapes, as shown in FIG. 6D. The isotropic etching is accomplished by the same process as shown in FIGS. 2A through 2C. The silicon substrate 60 under the end part linking posts 100B as etching layers functions as an etching stop layer, and the silicon substrate 60 is not etched. The etchant HF can be cited as an example of an isotropic etchant having a high selection ratio with respect to SiO$_2$, for example, as the material of the end part linking posts 100B which are etching layers.

3.8 Step of Removing Mask Layer

Figure 6E:
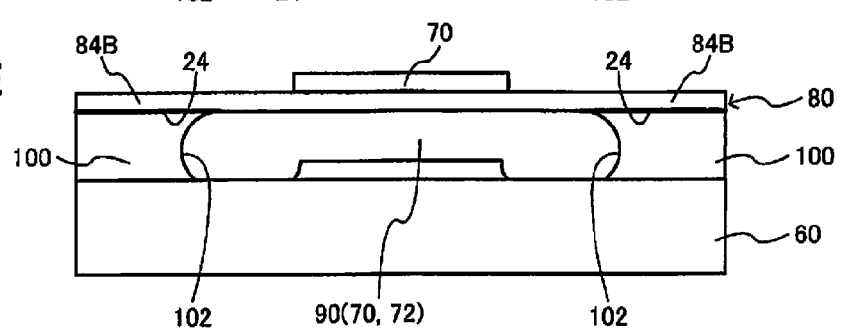

This step is a step of removing, as shown in FIG. 6E, the mask layer 24 that remains in the first and second cavities 30, 32 as shown in FIG. 6D, and is performed as needed. This step may be separate from the isotropic etching step of FIG. 6D, but a configuration may be adopted in which the mask layer 24 is also removed at completion of the isotropic etching of FIG. 6D by adjusting the selection ratio with respect to the barrier film 24 and the linking end parts 100B, for example.

4. Method for Processing Second Linking Part

Figure 9:
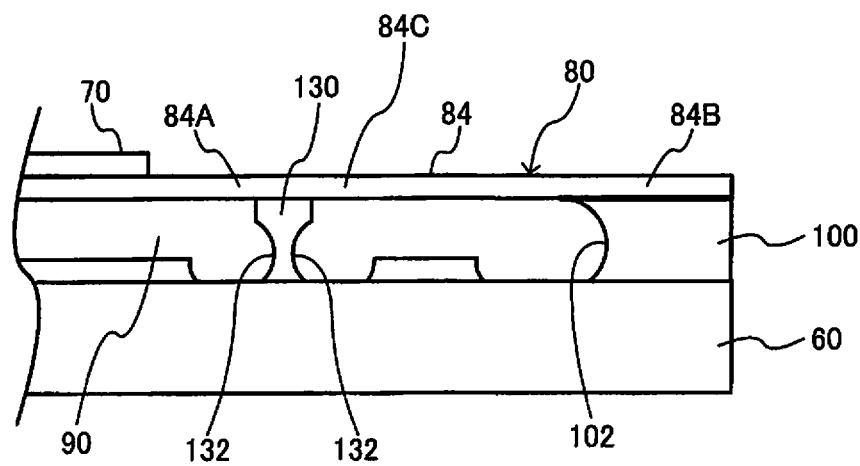
FIG. 9 is a view showing an embodiment in which the method of the present invention is applied to a linking part in a middle position other than that of the linked end part of the arm.
Figure 10:
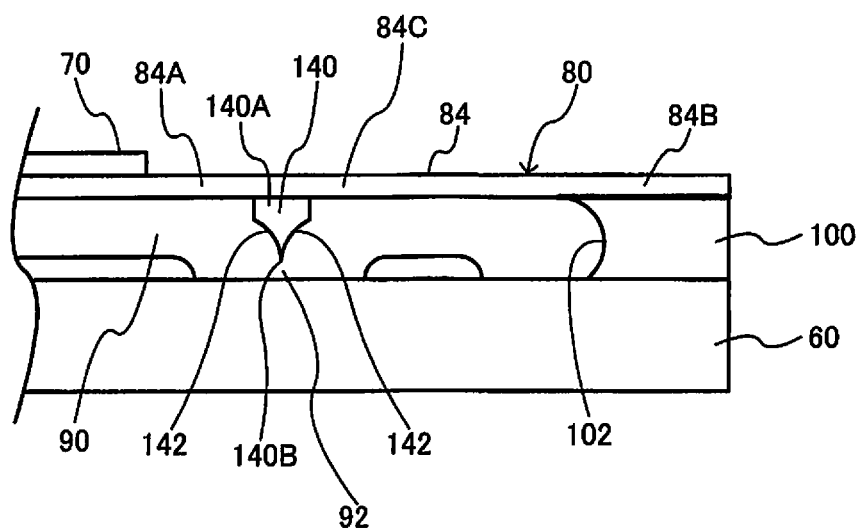
FIG. 10 is a view showing an embodiment in which the method of the present invention is applied to a spacer member in a middle position other than that of the linked end part of the arm.

In another embodiment of the present invention, a linking part is formed also in a middle position other than that of the linked end parts 84B of the arms 84 shown in FIG. 4B. As shown in FIG. 9, a middle linking post (second linking part) 130 formed in a columnar shape in the cavity 90 may be further included in order to link the support member 80 and the substrate 60 as the fixed part. In the present embodiment, the middle linking post 130 links a single location of a middle position 84C between a proximal end part 84A and the linked end part 84B of the arm 84 with the substrate 60. This configuration is not limiting, a plurality of middle linking posts 130 may be provided so as to link a plurality of middle positions of the arm 84, and the mounting member 82 and the substrate 60 may be linked by the middle linking post 130.

The middle linking post 130 prevents the narrow, long arm 84 from flexing during manufacturing or after finishing due to inadequate flexural rigidity by linking the arm 84 to the substrate 60 at a middle position other than that of the linked end part 84B of the arm 84. However, since the middle linking post 130 also becomes a heat transfer path in the same manner as the end part linking posts 100, a thermal-resistance-increasing part must be maintained, the same as in the end part linking posts 100.

An undercut shape is therefore formed in the middle linking post 130 as well, as shown in FIG. 9. Before the undercut shape is provided to the middle linking post 130, a round column, square column, or other column-shaped middle linking post is formed in advance in the first cavity 30 when the etching layer 100A is isotropically etched to form the first cavity 30 in the step shown in FIG. 5B. An etchant feeding hole in the shape of a ring, for example, is formed in the mask layer 24 so that a bottom wall 100B3 on the periphery of the middle linking post is exposed. In the step shown in FIG. 6D, by feeding the etchant via the ring-shaped etchant feeding hole, the round column, square column, or other column-shaped middle linking post can be formed into the middle linking post 130 having an undercut-shaped peripheral wall 132 shown in FIG. 9.

At this time, when the etchant is fed from the entire periphery of the middle linking post, the shape of the longitudinal section of the middle linking post 130 becomes line symmetrical about the longitudinal center line thereof. The middle linking post 130 is thus isotropically etched from the entire periphery thereof, and the cross-sectional area therefore is reduced. High thermal resistance can therefore be maintained. The shape of the middle linking post 130 can also be changed depending on the size or position of the etchant feeding hole, and the shape of the middle linking post 130 need not necessarily be formed so that the shape of the longitudinal section thereof is line symmetrical about the longitudinal center line.

5. Method for Processing Spacer Member

In another embodiment of the present invention, a spacer member 140 may be further provided extending in a columnar shape within the cavity 90 toward a free end part 140B on the side of the substrate 60 as the fixed part from a proximal end 140A on the side of the support member 80, at a middle position other than that of the linked end part 84B of the arm 84 shown in FIG. 4B.

In the present embodiment, the spacer member 140 protrudes toward the substrate 60 from a single location at the middle position 84C between the linked end part 84B and the proximal end part 84A of the arm 84. This configuration is not limiting, and spacer members 140 may be provided in a plurality of middle positions of the arm 84, or a spacer member 140 may be provided to the bottom surface of the mounting part 82.

The middle linking post 130 can be considered to have a thermal-resistance-increasing part, but the solid head transfer path between the support member 80 and the substrate 60 cannot be completely blocked. A gap 92 communicated with the cavity 90 is therefore formed between the substrate 60 and the free end part 140B of the spacer member 140. A portion or all of the middle linking post 130 may thereby be replaced with the spacer member 140, or the spacer member 140 may be provided in addition to the middle linking post 130.

The spacer member 140 intervenes with a predetermined length between the support member 80 and the substrate 60, and therefore has the function of maintaining the interval between the support member 80 and the substrate 60. Since the gap 92 is formed in the step shown in FIG. 6D, which is substantially the final step, the support member 80 and the substrate 60 can remain linked during the prior manufacturing steps, and sticking can be reliably prevented.

The gap 92 and an undercut-shaped peripheral wall 142 of the spacer member 140 are formed in the isotropic etching step shown in FIG. 6D. The middle linking post 130 and the spacer member 140 can be formed simultaneously in the isotropic etching step shown in FIG. 6D, and formation of the middle linking post 130 or the spacer member 140 can be selected by varying the size of the etchant feeding opening, for example. When the etchant feeding opening is large, isotropic etching proceeds rapidly, and the spacer member 140 can be formed.

6. Thermal Detection Element

The detailed structure of the thermal detection element is not shown in the drawings described above, but known thermo-optical absorption elements include bolometer-type and pyroelectric-type elements. In a bolometer-type element, a resistance value is varied by the heat of light, e.g., infrared rays, and the infrared rays are detected, and an infrared detection element film can be formed by a temperature-dependent resistor. A pyroelectric infrared detection element will be described below with reference to FIG. 11.

Figure 11:
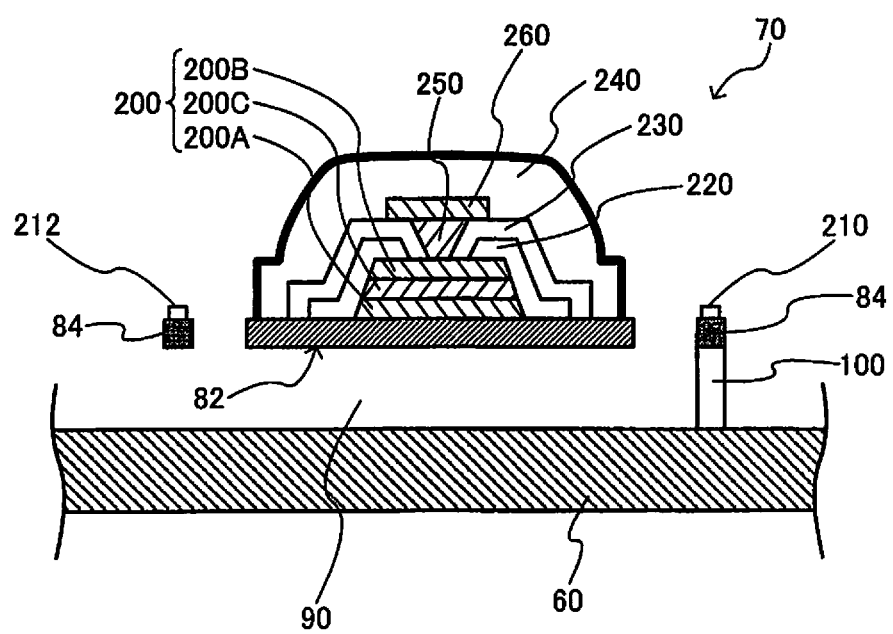
FIG. 11 is a sectional view showing an example of the thermo-optical detection element.

As shown in FIG. 11, the infrared detection element 70 includes a capacitor 200. The capacitor 200 includes a Pt or other first electrode (lower electrode) 200A mounted on the mounting member 82; a Pt or other second electrode (upper electrode) 200B disposed facing the first electrode 200A; and a PZT or other ferroelectric film 200C as a pyroelectric material disposed between the first and second electrodes 200A, 200B. The first electrode 200A is connected to an Al or other wiring layer 210 on one arm 84, and the second electrode 200B is connected to a wiring layer 212 of the other arm 84. The capacitor 200 undergoes spontaneous polarization based on heat evolution caused by infrared rays, and the infrared rays can be detected by retrieving the charge caused by the spontaneous polarization. Examples of possible methods of infrared detection include interrupting the infrared rays by a mechanical chopper and retrieving as an alternating electrical polarization effect, or applying a polar voltage for drawing in a surface charge with respect to the orientation of the spontaneous polarization and detecting the voltage across the terminals of the capacitor, which varies according to the charge drawn after voltage application is stopped.

The sides and top of the capacitor 200 may be covered by an electrical insulation film 230 via a hydrogen barrier film 220 composed of $Al_2O_3$ or the like for preventing degradation due to reduction of the ferroelectric film 200C, for example. The infrared-absorbing film 240 composed of $SiO_2$, SiN, SiCn, TiN, or the like, for example, is formed so as to cover the electrical insulation film 230. A plug (electrode contact) 250 is formed embedded in a contact hole (opening) formed in the hydrogen barrier film 220 and the electrical insulation film 230, and the second electrode 200B and a wiring layer 260 are electrically connected via the plug 250.

The surface side of the infrared detector which includes the infrared-absorbing film 240, the support member 80, and the wiring layers 210, 212 is not shown in the drawing, but may be covered by an upper protective film which functions as a mask layer during etching formation of the sacrificial layer 120 disposed in the cavity 90 in the manufacturing process.

7. Electronic Instrument

Figure 12:
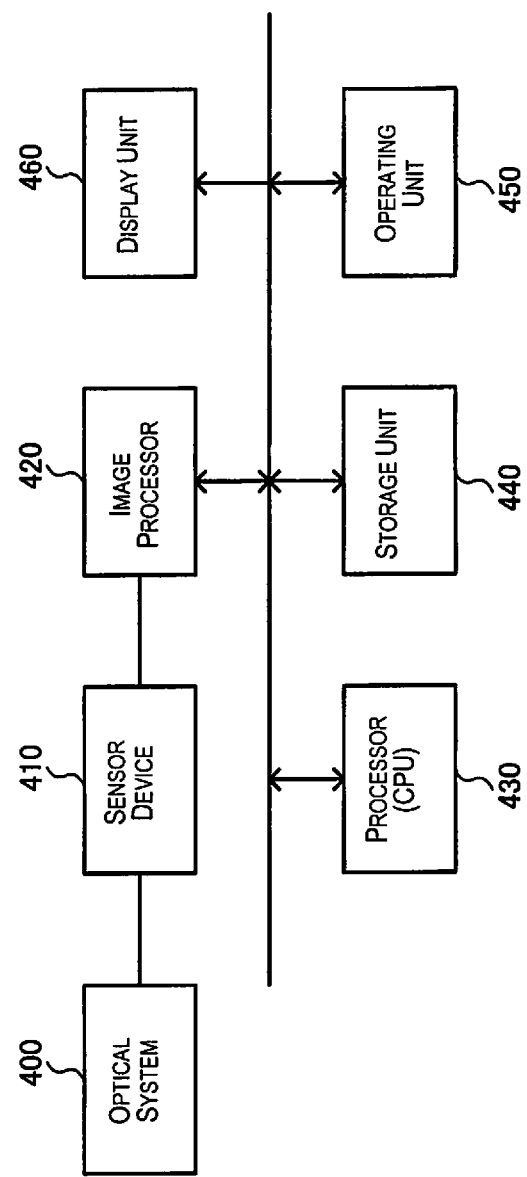
FIG. 12 is a block diagram showing an example of the configuration of the electronic instrument.

FIG. 12 shows an example of the configuration of an electronic instrument which includes the thermal detector or thermal detection device of the present embodiment. The electronic instrument includes an optical system 400, a sensor device (thermal detection device) 410, an image processor 420, a processor 430, a storage unit 440, an operating unit 450, and a display unit 460. The electronic instrument of the present embodiment is not limited to the configuration shown in FIG. 12, and various modifications thereof are possible, such as omitting some constituent elements (e.g., the optical system, operating unit, display unit, or other components) or adding other constituent elements.

The optical system 400 includes one or more lenses, for example, a drive unit for driving the lenses, and other components. Such operations as forming an image of an object on the sensor device 410 are also performed. Focusing and other adjustments are also performed as needed.

The sensor device 410 is formed by arranging the optical detector of the present embodiment described above in two dimensions, and a plurality of row lines (word lines, scan lines) and a plurality of column lines (data lines) are provided. In addition to the optical detector arranged in two dimensions, the sensor device 410 may also include a row selection circuit (row driver), a read circuit for reading data from the optical detector via the column lines, an A/D converter, and other components. Image processing of an object image can be performed by sequentially reading data from optical detectors arranged in two dimensions.

The image processor 420 performs image correction processing and various other types of image processing on the basis of digital image data (pixel data) from the sensor device 410.

The processor 430 controls the electronic instrument as a whole and controls each block within the electronic instrument. The processor 430 is realized by a CPU or the like, for example. The storage unit 440 stores various types of information and functions as a work area for the processor 430 or the image processor 420, for example. The operating unit 450 serves as an interface for operation of the electronic instrument by a user, and is realized by various buttons, a GUI (graphical user interface) screen, or the like, for example. The display unit 460 displays the image acquired by the sensor device 410, the GUI screen, and other images, for example, and is realized by a liquid crystal display, an organic EL display, or other types of display.

A thermal detector of one cell may thus be used as an infrared sensor or other sensor, or the thermal detector of one cell may be arranged along orthogonal axes in two dimensions to form the sensor device (thermal detection device) 410, in which case a heat (light) distribution image can be provided. This sensor device 410 can be used to form an electronic instrument for thermography, automobile navigation, a surveillance camera, or another application.

As shall be apparent, one cell or a plurality of cells of thermal detectors may also be used in an object analysis instrument (measurement instrument) for analyzing (measuring) physical information of an object, in a security instrument for detecting fire or heat, in an FA (factory automation) instrument provided in a factory or the like, and in various other electronic instruments.

Several embodiments are described above, but it will be readily apparent to those skilled in the art that numerous modifications can be made herein without substantively departing from the new matter and effects of the present invention. All such modifications are thus included in the scope of the present invention. For example, in the specification or drawings, terms which appear at least once together with different terms that are broader or equivalent in meaning may be replaced with the different terms in any part of the specification or drawings.

The present invention is widely applicable to thermal detectors, and can be applied not only to pyroelectric-type thermal detectors, but to bolometer-type thermal detectors as well. The object of detection is also not limited to infrared rays, and may also be light in other wavelength regions.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A thermal detector comprising:
   a fixed part;
   a thermal detection device;
   a supporting member having a first plane and a second plane opposing to the first plane,
   a cavity formed between the first plane and the fixed part; and
   a connection portion connecting the supporting member with the fixed part;
   wherein the connection portion includes a curvature plane between the supporting member and
   the fixed part and the curvature plane facing the cavity.

2. The thermal detector recited in claim 1 further comprising:
   the curvature plane recessed backward from the cavity.

3. The thermal detector recited in claim 1 further comprising:
   the supporting member includes a long side and a short side;
   the curvature plane has an axis along the short side.

4. The thermal detector recited in claim 2 further comprising:
   the supporting member includes a long side and a short side;
   the curvature plane has an axis along the short side.

* * * * *